(12) United States Patent
Chien et al.

(10) Patent No.: US 10,020,335 B2
(45) Date of Patent: Jul. 10, 2018

(54) SHORT-RESISTANT CHIP-SCALE PACKAGE (71) Applicant: OmniVision Technologies, Inc., Santa Clara, CA (US)

(72) Inventors: Wei-Chih Chien, Zhubei (TW); Ying-Chih Kuo, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/261,444

(22) Filed: Sep. 9, 2016

(65) Prior Publication Data
US 2018/0076248 A1 Mar. 15, 2018

(51) Int. Cl.
*H01L 23/48* (2006.01)
*H01L 21/44* (2006.01)
*H01L 27/146* (2006.01)

(52) U.S. Cl.
CPC .. *H01L 27/14632* (2013.01); *H01L 27/14636* (2013.01); *H01L 27/14687* (2013.01)

(58) Field of Classification Search
CPC ......... H01L 27/14632; H01L 27/14687; H01L 27/14636
See application file for complete search history.

(56) References Cited

U.S. PATENT DOCUMENTS 7,968,448 B2 * 6/2011 Tsai ................... H01L 24/11
257/E21.508

8,384,222 B2 * 2/2013 Tsai ..................... H01L 24/11
257/765
9,673,093 B2 * 6/2017 Hsieh ................ H01L 21/76879
2006/0214308 A1 9/2006 Yu et al.
(Continued)

FOREIGN PATENT DOCUMENTS

| CN | 101044618 A | 9/2007 |
| CN | 101197340 A | 6/2008 |
| CN | 103681372 A | 3/2014 |

OTHER PUBLICATIONS

He, X. et al., "Effects of Solder Mask on Electrochemical Migration of Tin-Lead and Lead-Free Boards", As originally published in the IPC Printed Circuit Expo, APEX & Designer Summit Proceedings (2010), 14 pages.

(Continued)

*Primary Examiner* — Alonzo Chambliss
(74) *Attorney, Agent, or Firm* — Lathrop Gage LLP (57) ABSTRACT

A short-resistant CSP includes an isolation layer, an electrically conductive RDL, and an insulating layer. The electrically conductive RDL is on the isolation layer and includes a first and a second RDL segment. The insulating layer includes a first insulator portion between the isolation layer and the first RDL segment to improve electrical isolation between the first and second RDL segments. A method for preventing short-circuiting between conductors of CSP includes (1) depositing a first insulating layer on a first substrate region, (2) depositing a RDL segment on the substrate above the first substrate region, at least a portion of the first insulating layer being between the first RDL segment and the first substrate region, and (3) depositing a second RDL segment on the substrate above a second substrate region, such that the first insulating layer interrupts a leakage current path between the first and second RDL segments.

15 Claims, 5 Drawing Sheets

(56) References Cited

U.S. PATENT DOCUMENTS

| | | |
|---|---|---|
| 2008/0197435 A1 | 8/2008 | Yang et al. |
| 2009/0096093 A1 | 4/2009 | Yang et al. |
| 2011/0204515 A1* | 8/2011 | Fazelpour ............ H01L 23/3114 |
| | | 257/738 |
| 2012/0205799 A1 | 8/2012 | Lin |
| 2014/0138834 A1 | 5/2014 | Pritiskutch et al. |
| 2015/0041985 A1* | 2/2015 | Hsieh ................ H01L 21/76879 |
| | | 257/773 |

OTHER PUBLICATIONS

Bumiller, E. & Hillman, C., White Paper, DfR Solutions, "A Review of Models for Time-to-Failure Due to Metallic Migration Mechanisms" (2006) 14 pages.

Taiwanese Patent Application No. 106126786, English translation of Office Action dated Dec. 28, 2017, 5 pages.

Taiwanese Patent Application No. 106126786, Office Action dated Dec. 28, 2017, 5 pages.

* cited by examiner

SHORT-RESISTANT CHIP-SCALE PACKAGE

BACKGROUND

Figure 1:
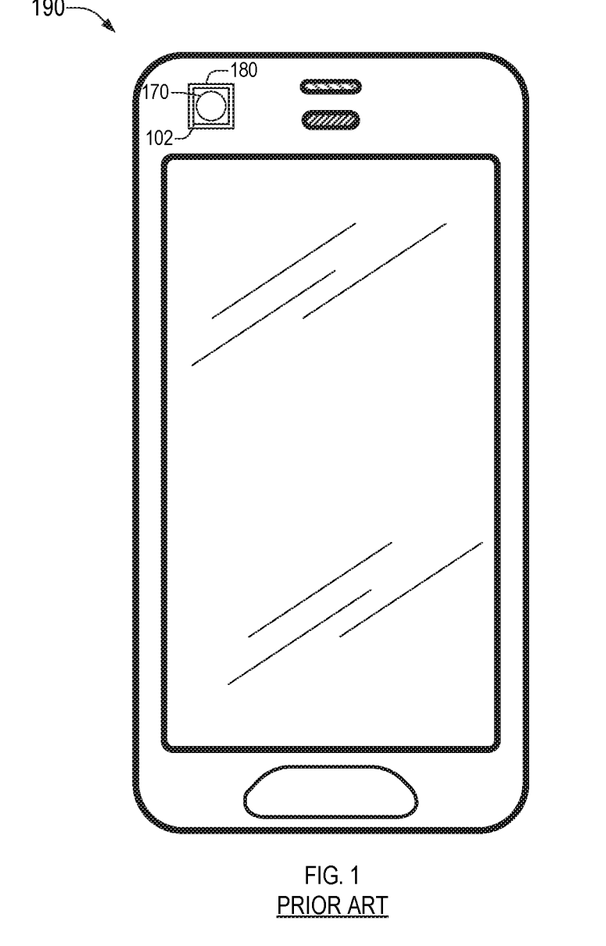
FIG. 1 shows a mobile device that includes an image sensor integrated into a camera module.

Many high-volume consumer products such as mobile devices and motor vehicles now include a digital camera. For example, FIG. 1 shows a mobile device 190 having a camera module 180 integrated therein. Camera module 180 includes an image sensor 102 beneath an imaging lens 170.

Figure 2A:
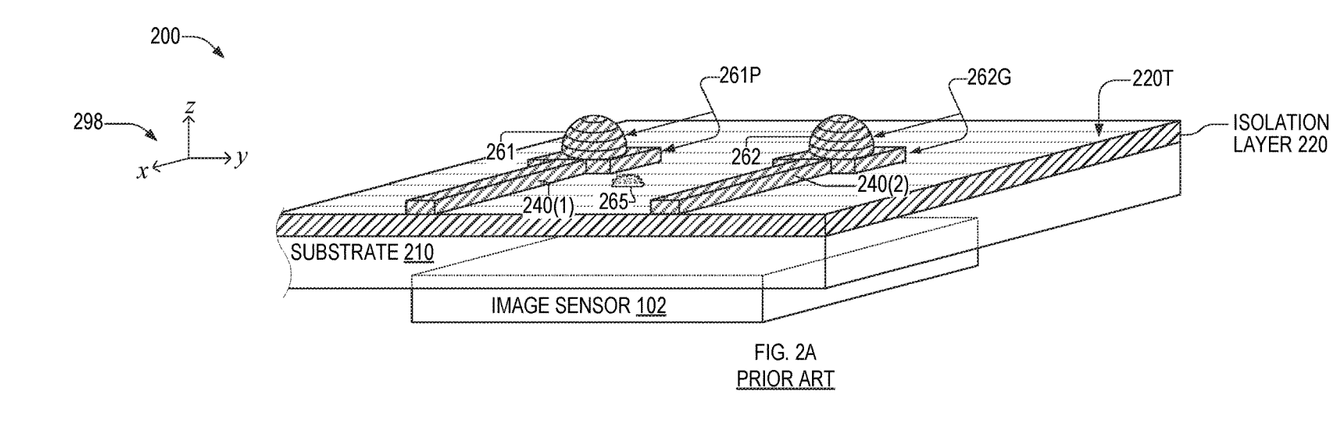
FIG. 2A a perspective view and FIG. 2B is a cross-sectional view of a CSP that includes the image sensor of FIG. 1
Figure 2B:
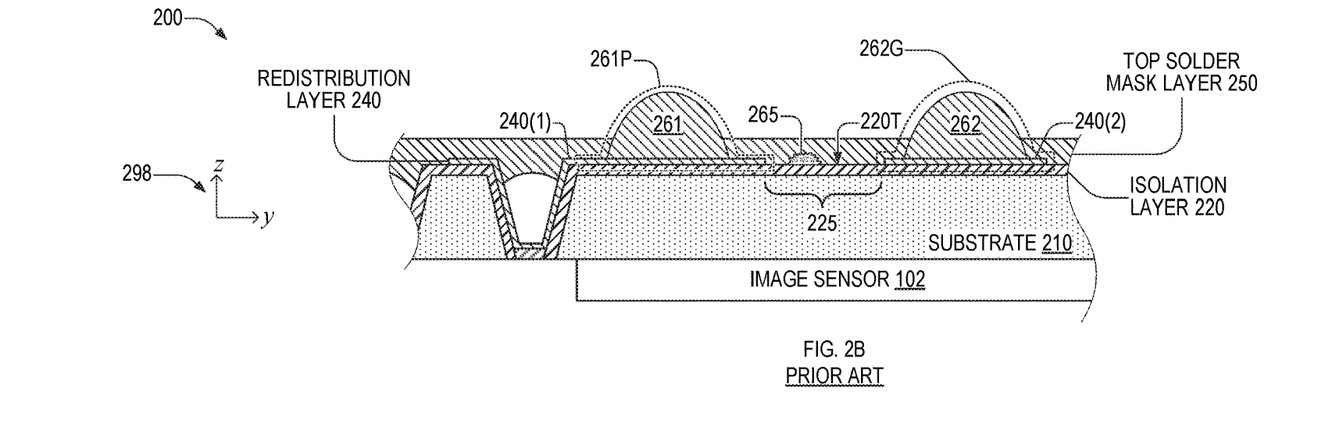

FIG. 2A is a perspective view and FIG. 2B is a cross-sectional view of a chip-scale package (CSP) 200 that includes image sensor 102. The cross-sectional view of FIG. 2B is in a plane parallel to the y-z plane of coordinate system 298. CSP 200 includes a substrate 210, an isolation layer 220, an electrically conductive redistribution layer (RDL) 240, a top solder mask layer 250, and solder ball pads 261 and 262. For clarity of illustration, top solder mask layer 250 is omitted from FIG. 2A. FIGS. 2A and 2B include RDL segments 240(1-2), which are part of RDL 240. Substrate 210 is formed of silicon for example, and isolation layer 220 may be formed thereon via plasma-enhanced chemical vapor deposition. Isolation layer 220 may be regarded as part of substrate 210. Isolation layer 220 has a top surface 220T.

Solder ball pads 261 and 262 are electrically connected to RDL segments 240(1) and 240(2), respectively. Solder ball pad 261 and a portion of RDL segment 240(1) form a power pin 261P configured to be electrically connected to a voltage source. Solder ball pad 262 and a portion of RDL segment 240(2) form a ground pin 262G.

A problem with current CSPs is that they are prone to failure in humid environments, as evidenced by failures in temperature-humidity-bias testing. In a humid environment, surface insulation resistance decreases between adjacent conductors, such as RDL segments 240(1-2), which results in electrochemical migration and current leakage or short-circuiting of the power and ground pins. For example, metal species 265 (such as nickel) migrates to top surface 220T in an isolation layer region 225, in which top surface 220T functions as a leakage-current path between pins 261P and 262G.

SUMMARY OF THE INVENTION

The present invention provides a way to prevent failures related to the aforementioned electrochemical migration.

In one embodiment, a short-resistant chip-scale package (CSP) is disclosed. The short-resistant CSP includes an isolation layer, an electrically conductive redistribution layer (RDL), and an insulating layer. The electrically conductive RDL is on the isolation layer and includes a first RDL segment and a second RDL segment. The insulating layer includes a first insulator portion between the isolation layer and the first RDL segment to improve electrical isolation between the first RDL segment and the second RDL segment.

In a second embodiment, a method for preventing short-circuiting between conductors of a CSP is disclosed. The method includes (1) depositing a first insulating layer on a first substrate region, (2) depositing a first redistribution layer (RDL) segment on the substrate above the first substrate region, at least a portion of the first insulating layer being between the first RDL segment and the first substrate region, and (3) depositing a second RDL segment on the substrate above a second substrate region, such that the first insulating layer interrupts a leakage current path between the first and second RDL segments.

DETAILED DESCRIPTION OF THE EMBODIMENTS

Figure 3A:
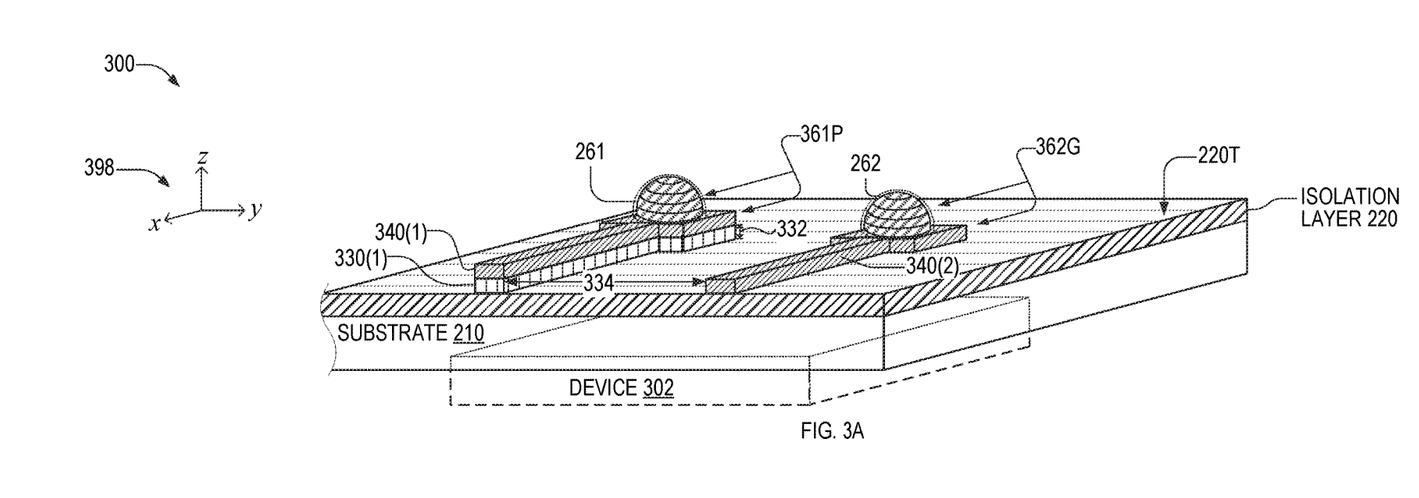
FIG. 3A a perspective view and FIG. 3B is a cross-sectional view of a short-resistant CSP compatible for use in the device of FIG. 1, in an embodiment.
Figure 3B:
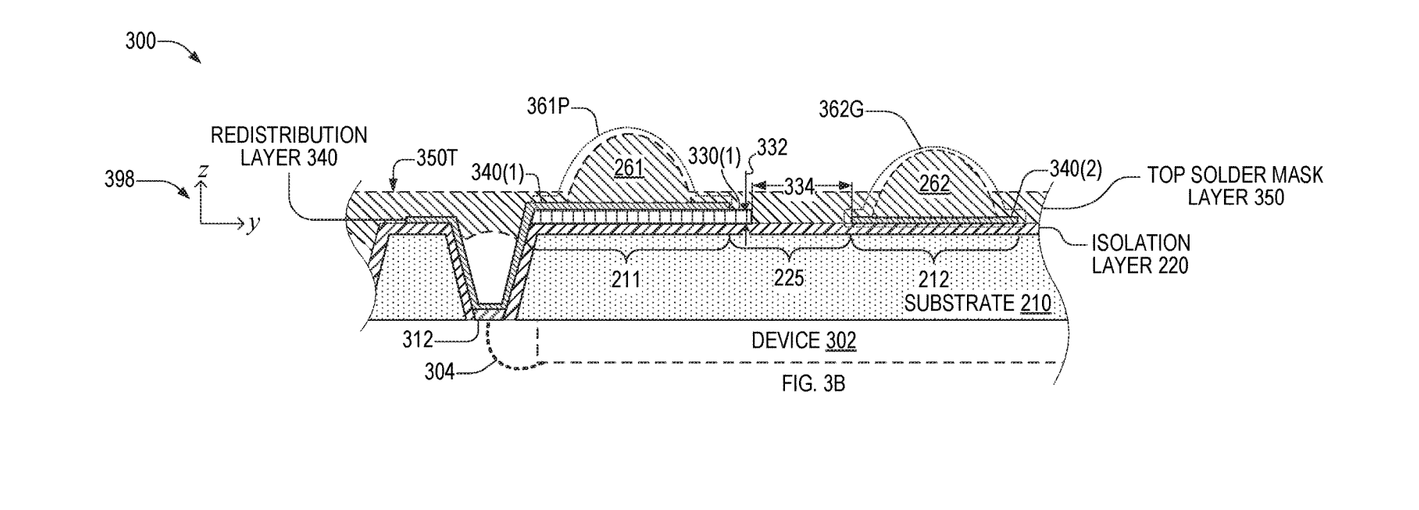

FIG. 3A a perspective view and FIG. 3B is a cross-sectional view of a short-resistant CSP 300. The cross-sectional view of FIG. 3B is in a plane parallel to the y-z plane of coordinate system 398. CSP 300 includes substrate 210, a patterned RDL 340, and optionally top solder mask layer 350 and solder ball pads 261 and 262. RDL 340 and top solder mask layer 350 are similar to RDL 240 and top solder mask layer 250, respectively. For clarity of illustration, top solder mask layer 250 is omitted from FIG. 3A. RDL 240 includes RDL segments 340(1-2). CSP 300 may also include isolation layer 220 and a device 302, as shown in FIGS. 3A-3B. Of RDL 340, FIGS. 3A and 3B illustrate an RDL non-ground segment 340(1) and an RDL-ground segment 340(2) above substrate regions 211 and 212 respectively of substrate 210. RDL non-ground segment 340(1) may be configured to be electrically connected to a voltage source.

Device 302 is for example image sensor 102, in which case CSP 300 is compatible for use in device 190 as a replacement for CSP 200. Device 302 may be on a top surface 350T of top solder mask layer 350 without departing from the scope hereof. Device 302 may be at least partially formed within substrate 210.

Solder ball pads 261 and 262 are electrically connected to RDL segments 340(1) and 340(2), respectively. Solder ball pad 261 and RDL segment 340(1) form a power pin 361P configured to be electrically connected to a voltage source. Solder ball pad 262 and RDL segment 340(2) form a ground pin 362G. Absent optional solder ball pads 261 and 262, pins 361P and 362G refer to their respective RDL segments 340(1) and 340(2).

CSP 300 also includes an insulating layer 330, of which insulating layer portion 330(1) is illustrated in FIG. 3A. Insulating layer 330 and insulating layer portion 330(1) thereof are between patterned RDL 340 and the substrate 210. RDL segment 340(1) is on the side of insulating layer portion 330(1) facing away from substrate 210. In embodiments including top solder mask layer 350, RDL segment 340(1) is between insulating layer portion 330(1) and top solder mask layer 350. Device 302 may be electrically connected to RDL 340. For example, device 302 is wire-bonded to RDL segment 340(1) via a wire 304 and a bonding pad 312.

Insulating layer portion 330(1) prevents or at least reduces electrochemical migration in isolation layer region 225 between pins 361P and 362G. Insulating layer portion 330(1) has a height 332 and is separated from RDL segment 340(2) by a minimum distance 334. The sum of height 332 and distance 334 exceeds a minimum distance, fifty micrometers for example, below which short circuiting or current leakage between pins 361P and 362G remains a non-trivial risk. Height 332 is for example between a minimum height of twenty micrometers and a maximum height of seventy micrometers. When height 332 is less than the minimum height, risk of device failure from short circuiting or current leakage becomes non-trivial. When height 332 exceeds the maximum height, surface-mount technology (SMT) process performance may be compromised, which also risks device failure.

In an alternative embodiment, insulating layer portion 330(1) is beneath ground pin 362G instead of power pin 361P. In another embodiment, a portion of insulating layer 330 is beneath both power pin 361P and ground pin 362G.

Isolation layer 220 may be formed of a polyimide, silicon carbide, an oxide, or other isolation layer material known in the art. Isolation layer 220 is for example formed via plasma-enhanced chemical vapor deposition (PECVD). Insulating layer 330 is for example formed of a conventional solder mask material known in the art, such as a polymer (e.g., polyimide). Insulating layer 330 is for example a liquid photoimageable solder mask material or a dry-film photoimageable solder mask material. Alternatively, insulating layer 330 may be formed from the same material as isolation layer 220. However, such an insulating layer may be cost-prohibitive if deposited via PECVD, which is typically more costly than solder mask deposition processes.

Insulating layer 330 may have a surface resistance $r_{330} > 10^{10}$ Ohms to prevent electrochemical migration, for example in the range from $10^{14}$ Ohms to $10^{15}$ Ohms. In one example, $r_{330} = 4.2 \times 10^{14}$ Ohms. Isolation layer 220 provides electrical insulation between substrate 210 and RDL 340, and may have a surface resistance $r_{220}$ that exceeds $r_{330}$.

Figure 4:
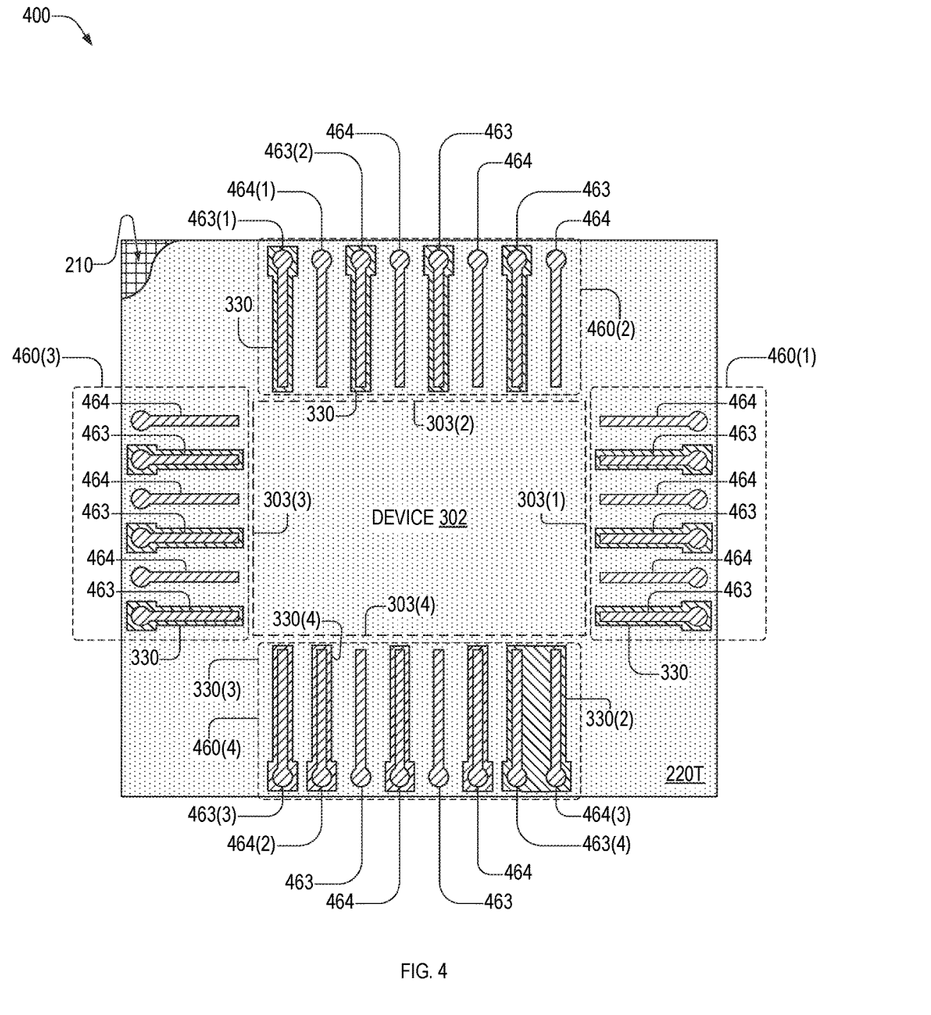
FIG. 4 is a plan view of a short-resistant CSP, which is an example of the short-resistant CSP of FIGS. 3A-3B.

FIG. 4 is a plan view of a short-resistant CSP 400, which is an example of short-resistant CSP 300. Short-resistant CSP 400 includes substrate 210, isolation layer 220, insulating layer 330, a plurality of conductive pins 463, a plurality of conductive pins 464, and insulating layer 330 beneath selected pins 463 and 464. Short-resistant CSP 400 also includes top solder mask layer 350 on surface 220T of isolation layer 220. For clarity of illustration, not all portions of insulating layer 330 are labeled. Although not shown in FIG. 4, CSP 400 may include top solder mask layer 350 without departing from the scope hereof.

Short-resistant CSP 400 may also include device 302 on either side of substrate 210, that is, on the same side or opposite side of substrate 210 that includes conductive pins 463-464. Device 302 includes sides 303(1-4) each having conductive pins 463-464 alongside in a respective conductive pin group 460(1-4). Each pin 463 is one of power pin 361P or ground pin 362G, and each pin 464 is the other of power pin 361P and ground pin 362G, such that a plurality of pairs of immediately adjacent pins 463 and 464 include one power pin 361P and one ground pin 362G. Short-resistant CSP 400 may include at least one of (a) two immediately adjacent ground pins and (b) two immediately adjacent power pins without departing from the scope hereof.

For any conductive pin 463 and immediately adjacent conductive pin 464, at least one of these two pins has a portion of insulating layer 330 therebeneath. For example, conductive pin 464(1) is closest to conductive pins 463(1) and 463(2), which each have a portion of insulating layer 330 therebeneath. Short-resistant CSP 300 may include two or more immediately adjacent conductive pins each with a respective portion of insulating layer 330 therebeneath, such as pins 463(3) and 464(2).

Short-resistant CSP 400 may include two or more immediately adjacent conductive pins with a single continuous portion of insulating layer 330 therebeneath, such as insulating layer portion 330(2) beneath pins 463(4) and 464(3). In an embodiment, a single continuous solder mask layer portion is beneath each conductive pin 463-464 on one or more sides 303 of device 302. For example, insulating layer portion 330(2) may extend beneath each conductive pin 463-464 of conductive pin group 460(4), and optionally beneath one more conductive pins of at least one conductive pin group 460(1-3).

Figure 5:
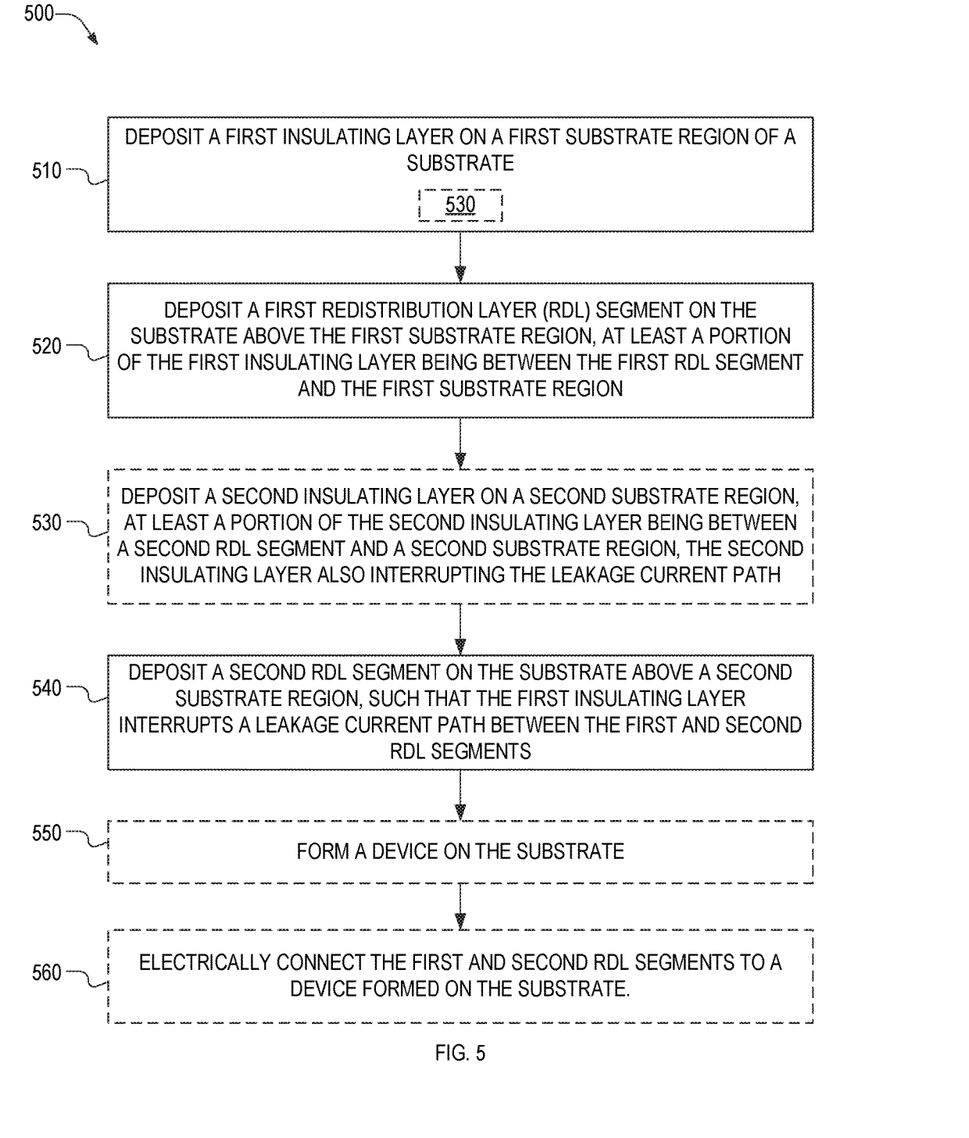
FIG. 5 is a flowchart illustrating a method for preventing short-circuiting between conductors of chip-scale package, in an embodiment.

FIG. 5 is a flowchart illustrating a method 500 for preventing short-circuiting between conductors of chip-scale package. In step 510, a first insulating layer is deposited on a first substrate region. The depositing the first insulating layer may include one or more deposition techniques known in the art. For example, when the first insulating layer is a solder mask material, step 510 may include depositing the solder mask material via one or more of the following methods: air spray, aerosol spray, electrostatic spray, curtain coating, screen printing, digital printing, photolithography, and other solder mask deposition methods known in the art.

In an example of step 510, insulating layer portion 330(1) is deposited on isolation layer 220 above substrate region 211 (FIGS. 3A-3B). In another example of step 510, insulating layer portion 330(3) is deposited on isolation layer 220, as shown in FIG. 4.

In step 520, a first RDL segment is deposited on the substrate above the first substrate region, such that at least a portion of the first insulating layer is between the first RDL segment and the first substrate region. In an example of step 520, RDL segment 340(1) is deposited on insulating layer portion 330(1) above substrate region 211 (FIGS. 3A-3B).

In step 540, a second RDL segment is deposited on the substrate above a second substrate region. Absent the first insulating layer, a substrate region between and including the first and the second substrate regions provides a leakage current path between the first and second RDL segments. The first insulating layer interrupts the leakage current path. In an example of step 540, RDL segment 340(2) is deposited on substrate 210 above substrate region 212, for example on isolation layer 220. Isolation layer region 225 is between RDL segments 340(1) and 340(2), and functions as a leakage current path in prior-art chip-scale package 200, which is interrupted by insulating layer portion 330(1).

Method 500 may include step 530 performed before step 540. In step 530, a second insulating layer is deposited on the second substrate region, at least a portion of the second insulating layer being between the second RDL segment and the second substrate region, in which second insulating layer also interrupts the leakage current path. In an example of step 530, insulating layer portion 330(4) deposited on isolation layer 220, as shown in FIG. 4. Step 530 may be part of step 510, such that the steps of depositing the first insulating layer and the second insulating layer are performed in a single step.

Method 500 may include step 550. In step 550, a device is formed on the substrate, the device being electrically connected to the first and second RDL segments. In an example of step 550, device 302 is formed on substrate 210.

Method 500 may further include step 560. In step 560, the first and second RDL elements are electrically connected to a device formed on the substrate. When method 500 includes both steps 550 and 560, the device of step 560 is for example the device formed in step 550. In an example of step 560, RDL segments 340(1) and 340(2) are electrically connected to device 302.

Combinations of features:

Features described above as well as those claimed below may be combined in various ways without departing from the scope hereof. The following examples illustrate some possible, non-limiting combinations:

(A1) A short-resistant CSP includes an isolation layer, an electrically conductive redistribution layer (RDL), and an insulating layer. The electrically conductive RDL is on the isolation layer and includes a first RDL segment and a second RDL segment. The insulating layer includes a first insulator portion between the isolation layer and the first RDL segment to improve electrical isolation between the first RDL segment and the second RDL segment.

(A2) In the short-resistant CSP denoted by (A1), one the first RDL segment and the second RDL segment may be a ground connection, the other one of the first RDL segment and the second RDL segment may be configured to be electrically connected to a voltage source.

(A3) In any short-resistant CSP denoted by one of (A1) and (A2), the sum of (i) thickness of the first insulator portion and (ii) distance between the first RDL segment and the second RDL segment may exceed fifty micrometers.

(A4) In any short-resistant CSP denoted by one of (A1) through (A3), the insulating layer may be composed of material having surface resistance greater than $10^{10}$ Ohms.

(A5) In any short-resistant CSP denoted by one of (A1) through (A4), the bottom solder mask may further include a second insulator portion between the second RDL segment and the isolation layer.

(A6) In the short-resistant CSP denoted by (A5), the second portion may be contiguous with the first insulator portion.

(A7) Any short-resistant CSP denoted by one of (A1) through (A6) may further include a top solder mask above the first insulator portion, the first RDL segment being located therebetween.

(A8) In any short-resistant CSP denoted by one of (A1) through (A7), the first insulator portion may adjoin the first RDL segment.

(A9) In any short-resistant CSP denoted by one of (A1) through (A8), the insulating layer may be formed of a solder mask material.

(A10) Any short-resistant CSP denoted by one of (A1) through (A9) may include an image sensor electrically connected to the first and second RDL segments.

(B1) A method for preventing short-circuiting between conductors of a CSP includes (1) depositing a first insulating layer on a first substrate region, (2) depositing a first redistribution layer (RDL) segment on the substrate above the first substrate region, at least a portion of the first insulating layer being between the first RDL segment and the first substrate region, and (3) depositing a second RDL segment on the substrate above a second substrate region, such that the first insulating layer interrupts a leakage current path between the first and second RDL segments.

(B2) The method denoted by (B1) may also include, before depositing the second RDL segment, depositing a second insulating layer on the second substrate region, at least a portion of the second insulating layer being between the second RDL segment and the second substrate region, the second insulating layer also interrupting the leakage current path.

(B3) In a method denoted by one of (B1) and (B2), the steps of depositing the first insulating layer and the second insulating layer may be performed in a single step.

(B4) Any method denoted by one of (B1) through (B3), may further include electrically connecting the first and second RDL elements to a device formed on the substrate.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present methods and systems, which, as a matter of language, might be said to fall therebetween.

What is claimed is:

1. A short-resistant chip-scale package comprising:
a substrate including an isolation layer;
an electrically conductive redistribution layer (RDL) on the isolation layer and including a first RDL segment and a second RDL segment, a first RDL-region of the first RDL segment not being between the isolation layer and a first solder ball pad electrically connected to the first RDL segment; and
a first insulating layer between the isolation layer and the first RDL segment, and including a first insulating region, none of which is between the isolation layer and the first solder ball pad, to improve electrical isolation between the first RDL segment and the second RDL segment, no part of the first insulating layer being between the isolation layer and the second RDL segment, wherein each of the first RDL-region and the first insulating region having an elongated shape in a plane parallel to the isolation layer.

2. The short-resistant chip-scale package of claim 1, one of the first RDL segment and the second RDL segment being a ground connection, the other one of the first RDL segment and the second RDL segment configured to be electrically connected to a voltage source.

3. The short-resistant chip-scale package of claim 1, the sum of (i) thickness of the first insulating layer and (ii) distance between the first RDL segment and the second RDL segment exceeding fifty micrometers.

4. The short-resistant chip-scale package of claim 1, the first insulating layer being composed of material having surface resistance greater than $10^{10}$ Ohms.

5. The short-resistant chip-scale package of claim 1, the second RDL segment including a second RDL-region, none of which is between the isolation layer and a second solder ball pad electrically connected to the second RDL segment, and further comprising a second insulating layer between the second RDL segment and the isolation layer, and including a second insulating region, none of which is between the isolation layer and the second solder ball pad, the second insulating layer being spatially separated and distinct from the first insulating layer, no part of the second insulating layer being between the isolation layer and the first RDL segment.

6. The short-resistant chip-scale package of claim 1, further comprising a top solder mask, the first RDL-region being located between the first insulating region and the top solder mask.

7. The short-resistant chip-scale package of claim 1, the first insulating layer adjoining the first RDL segment.

8. The short-resistant chip-scale package of claim 1, the first insulating layer being formed of a solder mask material.

9. The short-resistant chip-scale package of claim 1, further comprising an image sensor formed on the substrate and electrically connected to the first and second RDL segments.

10. The short-resistant chip-scale package of claim 1, the second RDL segment being formed directly on the isolation layer.

11. A method for preventing short-circuiting between conductors of a chip-scale package comprising:
   depositing on a first substrate region of a substrate, a first insulating layer that includes a first insulating region;
   depositing a first redistribution layer (RDL) segment on the substrate above the first substrate region, at least a portion of the first insulating layer being between the first RDL segment and the first substrate region, the first RDL segment including a first RDL-region located between the first insulating region and the first substrate region, no part of the first RDL-region being between the insulating layer and a first solder ball pad electrically connected to the first RDL segment, wherein each of the first RDL-region and the first insulating region having an elongated shape in a plane parallel to the first substrate region;
   depositing a second RDL segment on the substrate above a second substrate region, no part of the first insulating layer being between the second RDL segment and the second substrate region, such that the first insulating layer interrupts a potential leakage current path between the first and second RDL segments; and
   depositing a solder mask on the substrate such that the first RDL-region is between the first insulating layer and an area of the solder mask covering the first RDL-region.

12. The method of claim 11, the second RDL segment including a second RDL-region, none of which is between the isolation layer and a second solder ball pad electrically connected to the second RDL segment, and further comprising, before depositing the second RDL segment depositing a second insulating layer on the second substrate region, at least a portion of a second insulating layer being between the second RDL segment and the second substrate region, the second insulating layer being spatially separated and distinct from the first insulating layer and no part of the second insulating layer being between the first substrate region and the first RDL segment, the second insulating layer also interrupting the leakage current path, the second insulating layer including, between the isolation layer and the second RDL-region, a second insulating region, none of which is between the isolation layer and the second solder ball pad.

13. The method of claim 12, the steps of depositing the first insulating layer and the second insulating layer being performed in a single step.

14. The method of claim 11, further comprising electrically connecting the first and second RDL segments to a device formed on the substrate.

15. The method of claim 11, the step of depositing the second RDL segment comprising depositing a second RDL segment directly on the substrate.

* * * * *

UNITED STATES PATENT AND TRADEMARK OFFICE
CERTIFICATE OF CORRECTION

PATENT NO. : 10,020,335 B2  
APPLICATION NO. : 15/261444  
DATED : July 10, 2018  
INVENTOR(S) : Wei-Chih Chien et al.

Page 1 of 1

It is certified that error appears in the above-identified patent and that said Letters Patent is hereby corrected as shown below:

In the Claims

Column 7, Lines 11-24, Claim 11:
"depositing, on a first substrate region of a substrate, a first insulating layer that includes a first insulating region;
depositing a first redistribution layer (RDL) segment on the substrate above the first substrate region, at least a portion of the first insulating layer being between the first RDL segment and the first substrate region, the first RDL segment including a first RDL-region located between the first insulating region and the first substrate region, no part of the first RDL-region being between the insulating layer and a first solder ball pad electrically connected to the first RDL segment, wherein each of the first RDL-region and the first insulating region having have an elongated shape in a plane parallel to the first substrate region;"
Should read:
--depositing, on a first substrate region of a substrate including an isolation layer thereon, a first insulating layer that includes a first insulating region, at least a portion of the isolation layer being between the first substrate region and the first insulating layer;
depositing a first redistribution layer (RDL) segment on the substrate above the first substrate region, at least a portion of the first insulating layer being between the first RDL segment and the first substrate region, the first RDL segment including a first RDL-region, the first insulating region being between the first RDL-region and the first substrate region, no part of the first RDL-region being between the insulating layer and a first solder ball pad electrically connected to the first RDL segment, wherein each of the first RDL-region and the first insulating region have an elongated shape in a plane parallel to the first substrate region;--

Signed and Sealed this  
Eighth Day of December, 2020

Andrei Iancu  
*Director of the United States Patent and Trademark Office*